United States Patent [19]

Namae

[11] 4,071,759
[45] Jan. 31, 1978

[54] SCANNING ELECTRON DEVICE
[75] Inventor: Takao Namae, Tokyo, Japan
[73] Assignee: Nihon Denshi Kabushiki Kaisha, Tokyo, Japan
[21] Appl. No.: 750,643
[22] Filed: Dec. 15, 1976
[30] Foreign Application Priority Data
  Dec. 19, 1975  Japan .................... 50-152073
[51] Int. Cl.$^2$ ............................. H01J 37/26
[52] U.S. Cl. ..................... 250/310; 250/397
[58] Field of Search ........... 250/310, 311, 397
[56] References Cited
U.S. PATENT DOCUMENTS

| | | | |
|---|---|---|---|
| 3,502,870 | 3/1970 | Fujiyasu et al. ............ | 250/310 |
| 3,614,311 | 10/1971 | Fujiyasu et al. ............ | 250/310 |
| 3,795,808 | 3/1974 | Drayton et al. ............ | 250/311 |
| 3,835,246 | 9/1974 | Muller et al. ............ | 250/311 |
| 4,020,343 | 4/1977 | Shimaya et al. ............ | 250/311 |

Primary Examiner—Bruce C. Anderson
Attorney, Agent, or Firm—Webb, Burden, Robinson & Webb

[57] ABSTRACT

A scanning electron microscope for displaying a scanning image on a cathode ray tube screen. A high magnification image is displayed within a low magnification image displayed on a cathode ray tube screen so that the relative positions of the low and high magnification images can be immediately observed. The magnification and the display area of the high magnification image is varied continuously.

6 Claims, 12 Drawing Figures

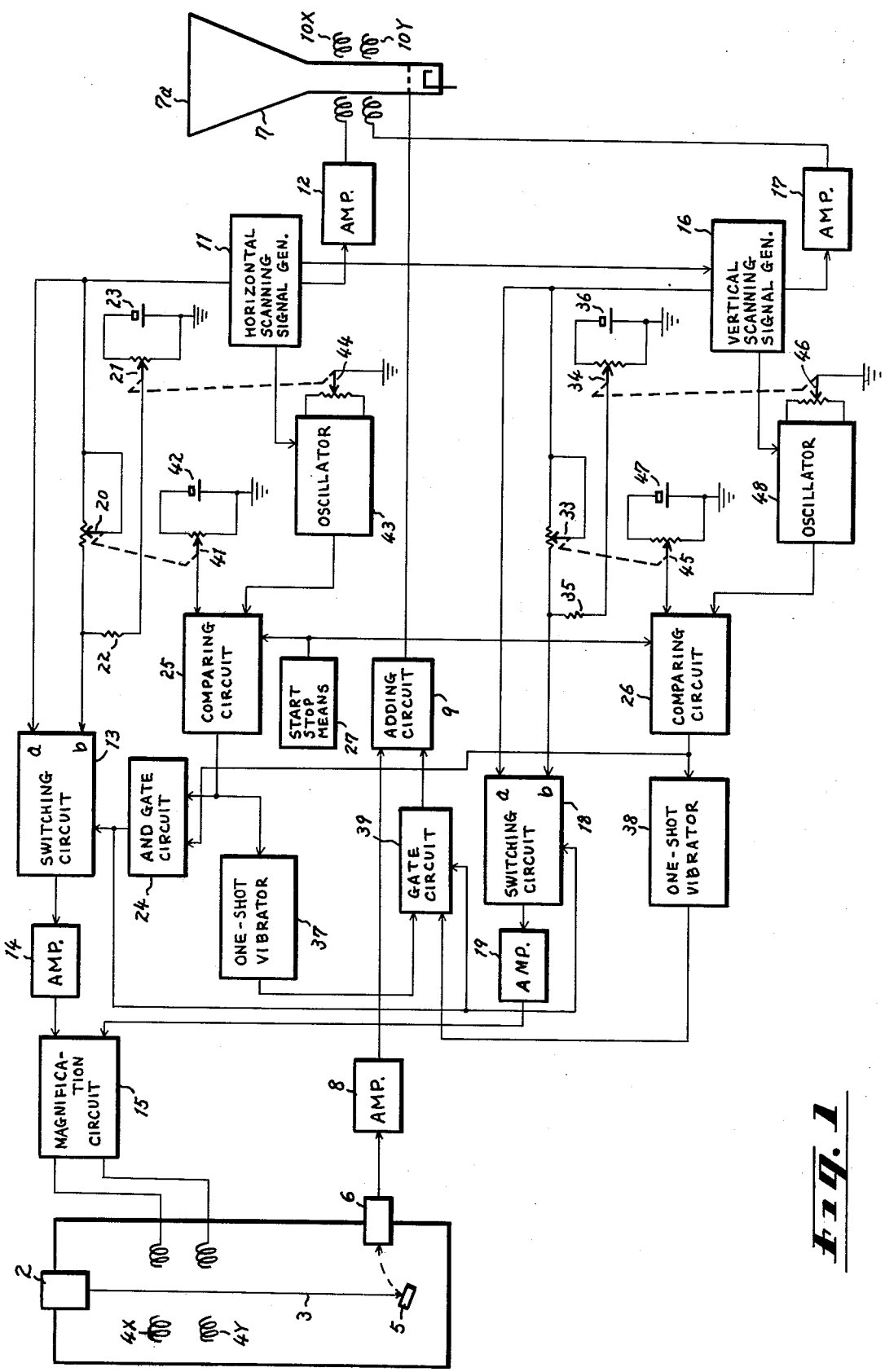

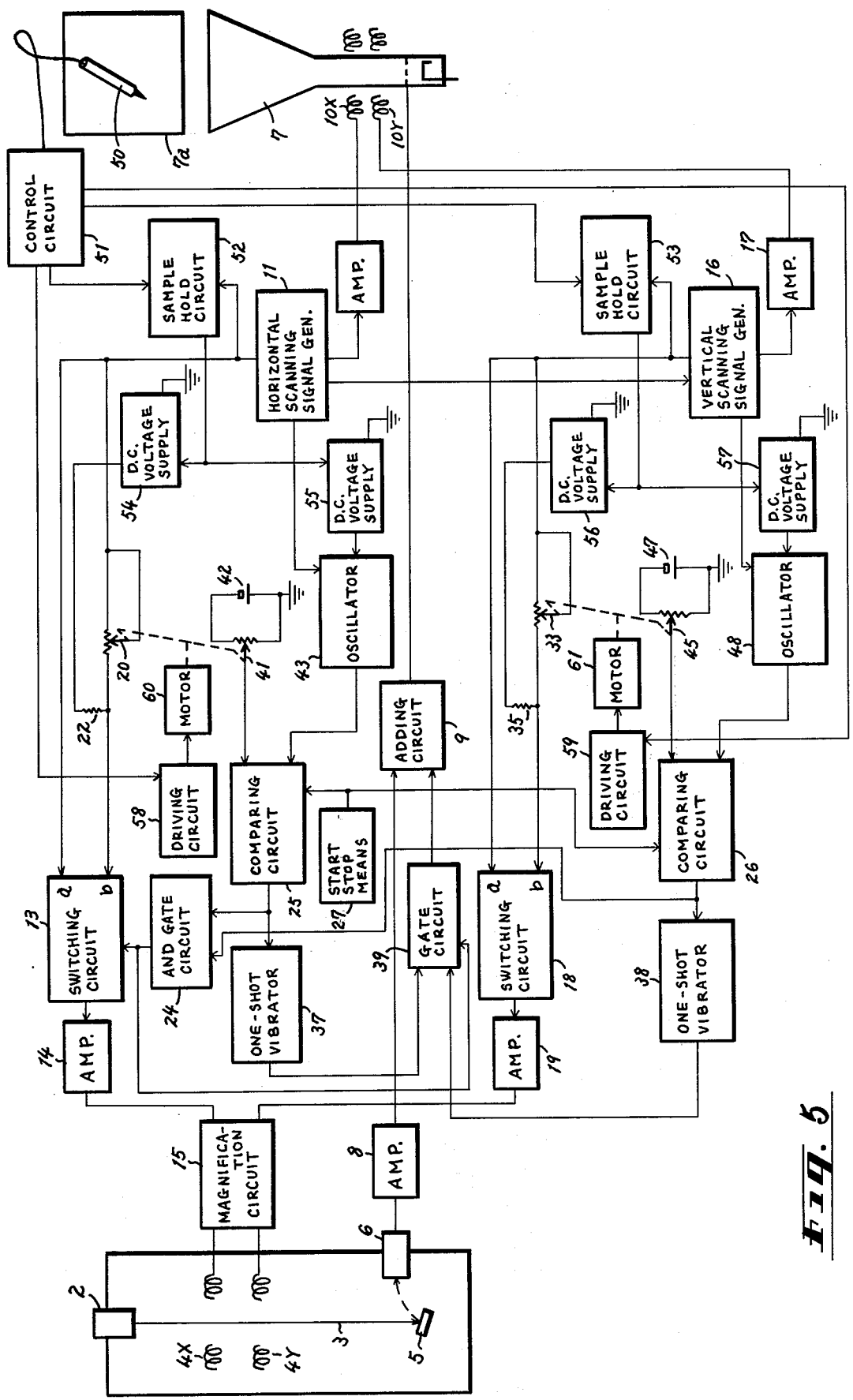

SCANNING ELECTRON DEVICE

This invention relates to an image display apparatus for use in a scanning electron microscope, X-ray microanalyzer or similar electronic display device.

In a scanning electron microscope, a specimen is scanned with an electron beam by a deflecting means and the secondary electrons emitted from the specimen are detected and used as CRT brightness modulation signals. The CRT deflecting means is supplied with a scanning signal in synchronism with the scanning signal for scanning the electron beam irradiating the specimen. Consequently, the magnification of the specimen scanning image displayed on the cathode ray tube screen varies according to the ratio of the scanning area (length) on the specimen surface and the scanning area (length) on the cathode ray tube screen. In general observation, the displayed image magnification is varied from several tens of times to three hundred thousand times. However, in order to know the correspondence between a low magnification image and a high magnification image, an apparatus capable of displaying two different magnification images independently is necessary.

One object of this invention, therefore, is to provide such an apparatus.

Another object of this invention is to provide an apparatus capable of displaying a small area high magnification image of a corresponding area within a wide area low magnification image.

A further object of this invention is to provide an apparatus for facilitating the selection of a high magnification image area by designating the desired area within a displayed low magnification image.

Other objects, features and advantages of the present invention will become more readily apparent by reading through the following description in conjunction with the accompanying drawings of which:

FIG. 1 is a schematic drawing showing one embodiment of this invention,

FIG. 5 is a schematic drawing showing another embodiment of this invention.

Figure 4A:
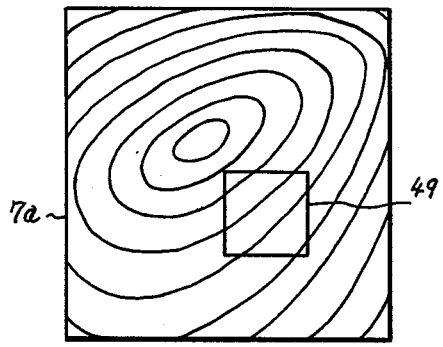

FIG. 1 shows one embodiment of this invention. In the figure, an electron optical column 1 of a scanning electron microscope houses an electron gun 2 for generating an electron beam 3, deflecting coils 4X and 4Y for scanning the electron beam 3 over a specimen 5 and a detector 6 for detecting the secondary electrons generated by the primary beams striking said specimen 5. The output signal of the detector 6 is applied to the brightness control electrode of a cathode ray tube 7 via an amplifier 8 and an adding circuit 9. Meanwhile, a horizontal (X-direction) scanning signal generator 11 supplies signals to CRT deflecting coil 10X via an amplifier 12 and to deflecting coil 4X via a switching circuit 13, an amplifier 14 and a magnification circuit 15. Likewise, a vertical (Y-direction) scanning signal generator 16 supplies signals to CRT deflecting coil 10Y via an amplifier 17 and to deflecting coil 4Y via a switching circuit 18, an amplifier 19 and the magnification circuit 15.

Consequently, if normal scanning signals are added to deflecting coils 4X and 4Y via input terminals "a" of switching circuits 13 and 18, the specimen scanning image brightness modulated by the secondary electron signal is displayed on the screen 7a of the cathode ray tube 7. In this case, however, the magnification of the image is determined by adjusting the signal amplitude of the magnification circuit 15.

Figure 2:
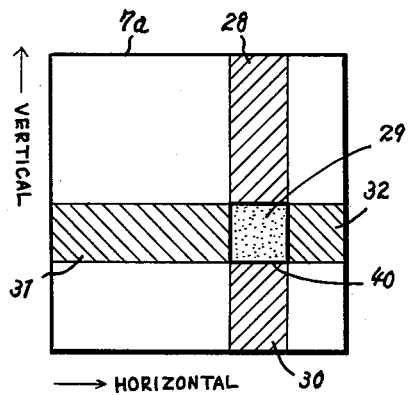
FIG. 2 is a schematic drawing showing the cathode ray tube screen incorporated in the embodiment of FIG. 1, FIGS. 3(a)–(f) and 4(a)–(c) are explanatory drawings for explaining the operation of the embodiment shown in FIG. 1.

Potentiometers 20, 21, resistor 22 and d.c. voltage supply 23, which are arranged between the output of the horizontal scanning signal generator 11 and the input terminal "b" of the switching circuit 13, form a circuit which serves to modify the output signal of the generating circuit 11 so that the gradient of the sawtooth waveform of the signal applied to terminal "b" of the switching circuit 13 becomes smaller than that applied to the terminal "a" of said switching circuit. The input signal at terminal "b" is applied to the amplifier 14 only when a control signal is supplied from AND gate circuit 24 which in turn generates output signals only when input pulses from comparators 25 and 26 are applied simultaneously. Said comparators 25 and 26 are activated and deactivated by signal from a start stop means 27. Comparator 25, in fact, generates pulses during the time the electron beam scans areas 28, 29 and 30 (a vertical band) on the cathode ray tube screen 7a and comparator 26 generates pulses during the time the electron beam scans areas 31, 29 and 32 (a horizontal band) on said screen 7a as shown in FIG. 2. Accordingly, AND gate circuit 24 generates pulses only when the electron beam scans area 29 (the intersection of the horizontal and vertical bands). The output pulse of AND gate circuit 24 is also applied to the switching circuit 18 so that the input signal at terminal "b" is outputed during the time the AND gate circuit 24 output pulse is applied. The input signal at terminal "b" of said switching circuit 18 is a vertical scanning signal modified from the output signal of vertical scanning signal generator 16 by potentiometers 33, 34, resistor 35 and d.c. voltage supply 36.

The outputs of comparators 25 and 26 are also applied to the one-shot vibrators 37 and 38 respectively which in turn generate narrow (short) pulses as the input pulses rise and fall. The outputs of said one-shot vibrators are applied to a gate circuit 39, which opens when the output of the AND circuit 24 is applied. After which, the output pulses of the gate circuit 39 are applied to the brightness control grid of the cathode ray tube 7 via adding circuit 9 so that a bright (or dark) line frame 40 enclosing area 29 on the cathode ray screen 7a is displayed.

The position and size of the bright (or dark) line frame 40 is determined by varying the input signals applied to comparators 25 and 26. One of the two input signals applied to comparator 25 is generated by potentiometer 41 and d.c. voltage supply 42, the other one being generated by an oscillator 43, which is controlled by a potentiometer 44 and synchronized with the horizontal scanning signal generator 11. Similarly, the input signals applied to comparator 26 are generated by potentiometers 45, 46 and d.c. voltage supply 47, and oscillator 48 respectively, the latter of which is synchronized with the vertical scanning signal generator 16.

FIG. 3 shows the output waveforms of the various circuits. FIG. 3(a) shows the output signal of the horizontal scanning signal generator 11 which always controls the scan of the CRT and controls the scan of the electron beam. FIG. 3(b) shows the output signal of the oscillator 43. It will be noted in FIG. 3(b) that although the output signal of the oscillator 43 has a constant peak height $V_p$, the position (time T) of the signal peak is varied by potentiometer 44. The voltage $V_m$ indicates the maximum output signal voltage of potentiometer 41. FIG. 3(c) shows the output signal of comparator 25. The pulse signals shown in the figure are generated when the output signal of the oscillator 43 is higher than the constant output voltage $V_T$ of potentiometer 41. FIG. 3(d) shows the output of the one-shot vibrator 37 which generates narrow (short) pulses as the input pulse waveform of the switching circuit 13 when the output voltage $V_T$ of the potentiometer 41 is adjusted as shown in FIG. 3(b), and FIG. 3(f) shows the output waveform of the switching circuit 13 when the output voltage of potentiometer 41 is adjusted so as to be less than the lowest (zero) value of the output signal of oscillator 43.

When the start stop means 27 is in the "stop" condition, comparators 25 and 26 are inactive. In this case, switching circuits 13 and 18 feed out the terminal "a" input signals with the result that normal scanning signals are applied to deflecting coils 4X and 4Y. Accordingly, a normal scanning image is displayed on the screen 7a of the cathode ray tube 7.

Figure 4B:
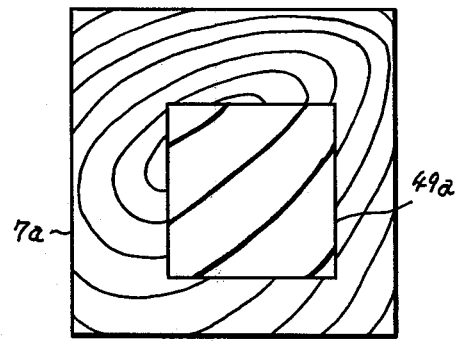
Figure 4C:
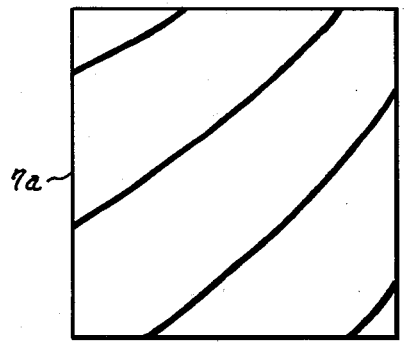
Figure 3A:
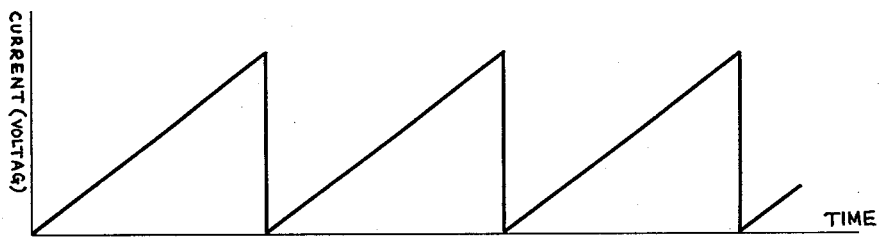
Figure 3B:
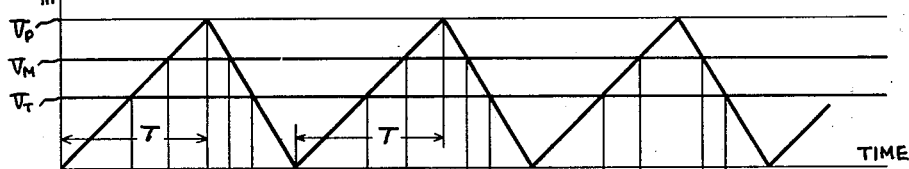
Figure 3C:
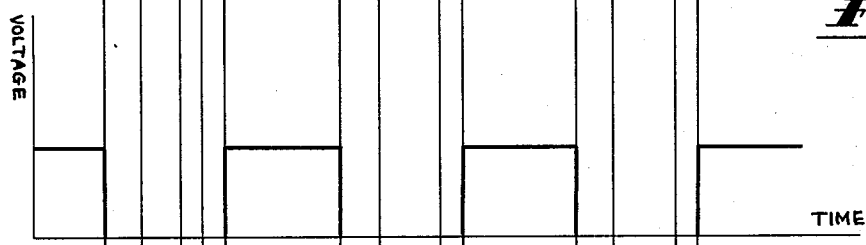
Figure 3D:
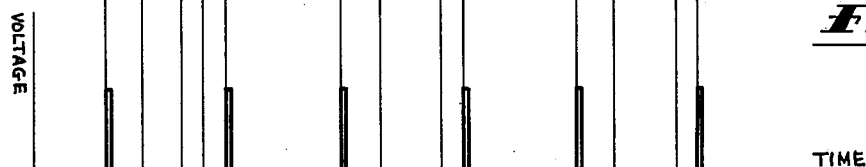
Figure 3E:
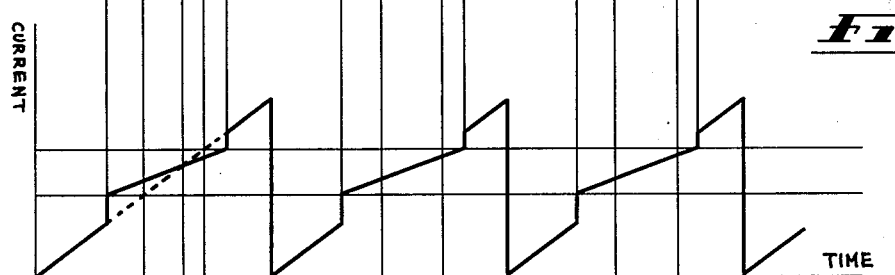
Figure 3F:
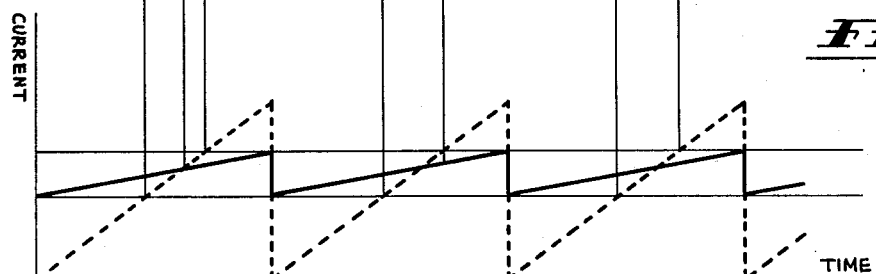

On the other hand, when the start stop means 27 is in the "start" condition, comparators 25 and 26 activated and potentiometer 41, interlocked with potentiometer 20, and potentiometer 45, interlocked with potentiometer 33, are regulated for maximum output value $V_M$. By so doing, the scanning image shown in FIG. 4(a) is displayed on the screen of the cathode ray tube 7. In the figure, a standard (low) magnification scanning image is displayed over the entire area of the screen and a small bright line frame 49 is superimposed thereon. The position of the bright line frame 49 is determined by adjusting potentiometers 20, 41, 33 and 45 so that the desired area of detailed observation is enclosed by said bright line frame 49. The potentiometer 21 interlocked with potentiometer 44, and potentiometer 34 interlocked with potentiometer 46 are then adjusted so that the desired high magnification image is displayed within the enlarged bright line frame 49a as shown in FIG. 4(b). If potentiometers 41 and 45 are now adjusted for the lowest voltage value, the bright line frame disappears off the screen and the high magnification image is displayed over the entire screen as shown in FIG. 4(c).

FIG. 5 shows another embodiment of this invention in which a light pen 50 equipped with a light sensitive element, for example, a photo diode and its control circuit 51 are incorporated so as to facilitate designation of the high magnification image position within the low (standard) magnification image.

The desired position within the low magnification image is touched by the light pen 50 and the value of the output signal of the horizontal or vertical scanning signal generator 11 or 16, at the time when the light pen 50 detects the bright point irradiated by the electron beam, is detected and held by sample hold circuit 52 or 53 and the control circuit 51. In this case, sample hold circuits 52 and 53 hold the signal value corresponding to the point designated by the light pen 50. The output of the sample hold circuit 52 or 53 controls d.c. voltage supplies 54, 55, 56 or 57. Namely, the adjustment of potentiometers 21, 44, 34 or 46 in the FIG. 1 embodiment is replaced by the light pen operation in this embodiment. At the same time, during the time the light pen is applied to the cathode ray screen, the output signal of control circuit 51 is applied to driving control circuits 58 or 59, which drive motors 60 or 61. Motors 60 or 61 rotate potentiometers 20 and 41, or 33 and 45. By so doing, potentiometers 20 and 41, or 33 and 45 are varied automatically so as to increase the magnification of the image area, on the cathode ray tube screen 7a enclosed by the bright lines. Accordingly, in this FIG. 5 embodiment, the operation of the image observation is easier than image observation utilizing the embodiment shown in FIG. 1.

Having thus described my invention in the detail and particularity required by the Patent Laws, what is desired to be protected by Letters Patent are set forth in the following claims.

I claimed:

1. In a scanning electron device comprising:
   an electron gun for generating an electron beam;
   deflecting means, which in response to X and Y deflecting signals, deflect said electon beam in a two-dimensional raster over a specimen;
   a cathode ray tube having deflecting means which in response to X and Y deflecting signals scans an electron beam over the face of the cathode ray tube;
   a scanning signal generator generating normal condition X and Y deflecting signals for the cathode ray tube and the deflecting means for the scanning electon beam such that they are scanned in synchronism;
   a detector for detecting signals emanating from the specimen, the output of said detector being supplied to modulate the brightness of the beam scanning the cathode ray tube screen thus producing an image;
   a magnification circuit arranged between the signal generator and the electron beam deflecting means for varying the amplitude of the electron beam X and Y deflecting signals and thus the magnification of the image produced on the cathode ray tube;
   the improvement for enabling the simultaneous display of a low magnification image and a high magnification inset image simultaneously comprising
   a modifying circuit for producing X and Y inset image scan deflecting signals having amplitudes and d.c. signal levels different from the output of the scanning signal generator output signals but of the same frequency;
   switching means arranged between the magnification circuit and the scanning signal generator and between the magnification circuit and the modifying means for switching between normal condition deflecting signals produced by the scanning signal generator and inset image deflecting signals produced by the modifying circuit;
   and a switching signal generator for generating signals to control the switching means.

2. The improvement according to claim 1 in which the switching signal generator may be adjusted to select the location and size of the inset image.

3. The improvement according to claim 2 wherein the switching signal generator produces X switching signals for switching between the normal condition X deflecting signals and the inset image X deflecting signal comprising:
   means for generating a triangle wave of constant amplitude and the same frequency as the normal condition X deflecting signals, means for establishing a threshold level and for producing switching signals when the triangle wave crosses the threshold level, means for adjusting the phase difference between the triangle wave and the normal condition X deflecting signal whereby the center of the inset image in the X direction may be adjusted and means for adjusting the threshold level whereby the width of the inset image may be adjusted.

4. The improvement according to claim 3 wherein the switching signal generator produces Y switching signals in the same manner.

5. The improvement according to claim 3 in which the d.c. signal level of the inset deflecting signal is automatically adjusted simultaneously with the phase difference between the triangle wave and the normal condition deflecting signal such that the inset deflecting signal has about the same value as the normal condition deflecting signal at the center of the inset.

6. The improvement according to claim 1 further comprising a light pen for detecting points on the cathode ray tube screen in which the switching signal generator is adjusted to produce the desired inset image by signals produced by said light pen.

* * * * *